United States Patent
Castaldo et al.

(10) Patent No.: US 7,403,441 B2
(45) Date of Patent: Jul. 22, 2008

(54) POWER MANAGEMENT UNIT FOR A FLASH MEMORY WITH SINGLE REGULATION OF MULTIPLE CHARGE PUMPS

(75) Inventors: Enrico Castaldo, Catania (IT); Antonino Conte, Tremestieri Etneo (IT); Salvatore Torrisi, Catania (IT); Vincenzo Sambataro, S. Maria Di Licodia (IT)

(73) Assignee: STMicroelectronics, S.r.l., Agrate Brianza (MI) (IT)

( * ) Notice: Subject to any disclaimer, the term of this patent is extended or adjusted under 35 U.S.C. 154(b) by 696 days.

(21) Appl. No.: 11/063,649

(22) Filed: Feb. 22, 2005

(65) Prior Publication Data

US 2006/0119383 A1    Jun. 8, 2006

(30) Foreign Application Priority Data

Feb. 20, 2004 (EP) ................................. 04100682

(51) Int. Cl.
*G11C 5/14* (2006.01)
(52) U.S. Cl. .................. 365/226; 365/189.05; 365/210; 365/189.09
(58) Field of Classification Search ................ 365/226, 365/189.05, 189.09, 210; 323/316
See application file for complete search history.

(56) References Cited

U.S. PATENT DOCUMENTS

| | | | |
|---|---|---|---|
| 5,568,424 A | 10/1996 | Cernea et al. | |
| 5,767,698 A * | 6/1998 | Emeigh et al. | 326/83 |
| 6,495,997 B2 * | 12/2002 | Hall et al. | 323/316 |
| 2002/0000871 A1 | 1/2002 | Davies | |
| 2003/0179609 A1 | 9/2003 | Natori | |

FOREIGN PATENT DOCUMENTS

EP         0905710 A      3/1999

OTHER PUBLICATIONS

European Search Report, EP 04100682, Aug. 13, 2004.

* cited by examiner

*Primary Examiner*—Son Dinh
(74) *Attorney, Agent, or Firm*—Lisa K. Jorgenson; Paul F. Rusyn; Graybeal Jackson Haley LLP

(57) ABSTRACT

A power management unit for a non-volatile memory device is proposed. The power management unit includes means for providing a reference voltage, resistive means for deriving a reference current from the reference voltage, means for generating a plurality of operative voltages from a power supply voltage, and means for regulating the operative voltages; in the power management unit of the invention, for each operative voltage the means for regulating includes means for deriving a scaled reference current from the reference current according to a scaling factor, further resistive means for deriving a rating voltage from the scaled reference current, means for deriving a measuring voltage from the operative voltage and the rating voltage, and means for controlling the operative voltage according to a comparison between the measuring voltage and the reference voltage.

25 Claims, 3 Drawing Sheets

POWER MANAGEMENT UNIT FOR A FLASH MEMORY WITH SINGLE REGULATION OF MULTIPLE CHARGE PUMPS

PRIORITY CLAIM

This application claims priority from European patent application No. EP04100682.6, filed Feb. 20, 2004, which is incorporated herein by reference.

TECHNICAL FIELD

The present invention relates to the non-volatile memory field, and more specifically to a power management unit for a non-volatile memory device.

BACKGROUND

Non-volatile memory devices require a number of different operative voltages for performing read/write operations on their memory cells (for example, relatively high voltages are needed to program and/or erase the memory device). Typically, the memory device includes a power management unit, which generates the different operative voltages from a single power supply voltage; in this way, it is possible to avoid the need of providing multiple external power supply voltages.

For each operative voltage, the power management unit generally includes a charge pump that boosts the power supply voltage to the desired value. The charge pump is coupled with a corresponding regulator, which maintains the operative voltage substantially constant under changing load conditions (in order to avoid any damage to the memory cells).

Several solutions are known in the art for implementing the regulator of each charge pump. For example, a circuit scheme based on a resistive divider is routinely used when a high accuracy of the operative voltage is required (such as for the programming operation). In this case, a measuring voltage is derived from the operative voltage, through a resistor that is biased by a current obtained from the reference voltage (through a further resistor); the measuring voltage is compared with a reference voltage (for example, provided by a band-gap circuit), and the charge pump is controlled accordingly. Therefore, the regulation only depends on the reference voltage (being accurate in its nature) and the ratio between two resistances (which ratio can be controlled with high accuracy when the memory device is realized as an integrated circuit).

Different solutions for the regulator are based on diode dividers or current measures. Those solutions find application when a lower accuracy of the operative voltage is acceptable (for example, for the reading operation).

A drawback of the power management units known in the art is that each charge pump is regulated independently.

Therefore, it is not possible to ensure a common level of quality in the regulation.

Moreover, each regulator must be trimmed individually to provide the desired accuracy.

Such a trimming operation is very time-consuming, and then reduces the throughput of a corresponding manufacturing process of the memory devices.

In any case, the accuracy of the reference voltage must be very high to ensure that any error in the operative voltages remains within an acceptable range. For example, in most applications the error of the reference voltage cannot exceed ±40 mV. The above-described requirement is quite stringent, and adversely affects the yield of the manufacturing process.

SUMMARY

It is an aspect of the present invention to provide a single regulation structure for the different operative voltages.

It is another aspect of the present invention to have a common level of quality in the regulation.

It is yet another aspect of the present invention to allow trimming all the operative voltages at the same time.

Moreover, it is an aspect of the present invention to reduce the time required for the trimming operation, thereby increasing the throughput of the corresponding manufacturing process.

Briefly, an aspect of the present invention provides a power management unit for a non-volatile memory device, the power management unit including means for providing a reference voltage, resistive means for deriving a reference current from the reference voltage, means for generating a plurality of operative voltages from a power supply voltage, and means for regulating the operative voltages, wherein for each operative voltage the means for regulating includes means for deriving a scaled reference current from the reference current according to a scaling factor, further resistive means for deriving a rating voltage from the scaled reference current, means for deriving a measuring voltage from the operative voltage and the rating voltage, and means for controlling the operative voltage according to a comparison between the measuring voltage and the reference voltage.

Moreover, an aspect of the present invention provides a corresponding method of operating the power management unit. A method of trimming the power management unit is also encompassed.

Further features and the advantages of the solution according to the present invention will be made clear by the following description of a preferred embodiment thereof, given purely by way of a non-restrictive indication, with reference to the attached figures, in which:

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
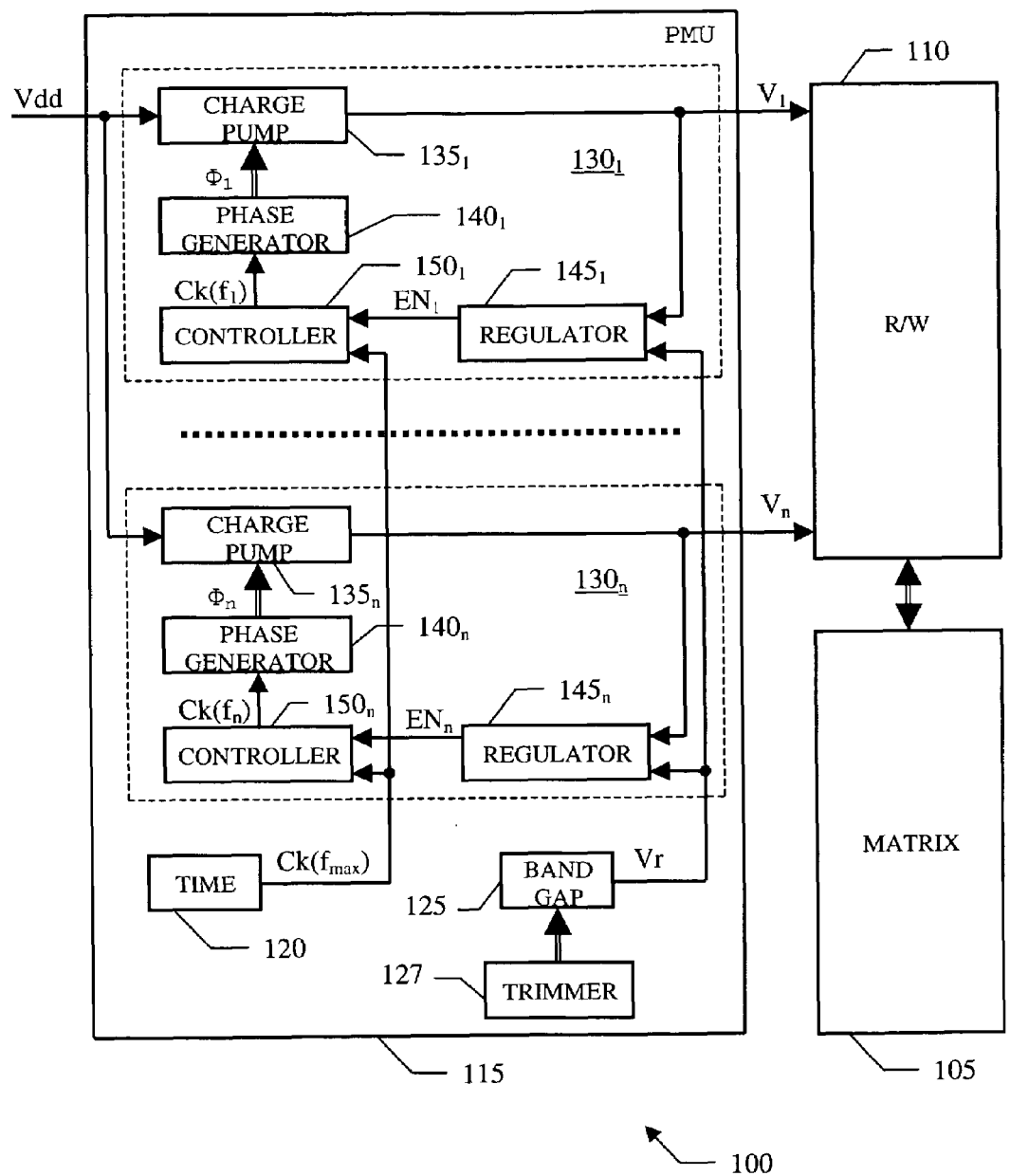
FIG. 1 depicts the functional blocks of a non-volatile memory device in which the power management unit of the invention can be used.

With reference in particular to FIG. 1, a non-volatile memory device 100 (consisting of an $E^2$PROM of the flash type) is schematically illustrated. The flash memory 100 is integrated in a chip of semiconductor material, and includes a matrix 105 of memory cells (typically consisting of floating gate MOS transistors); the matrix 105 also embeds multiple decoders, which are used to select the memory cells in response to a corresponding address.

The matrix 105 is coupled with a read/write unit 110; the read/write unit 110 includes all the components (such as program loads, sense amplifiers, comparators, reference cells, pulse generators, and the like) that are used for updating a content of the selected memory cells. Preferably, the flash memory 100 has a so-called page architecture, wherein the memory cells are grouped into sub-sets (pages) that can be erased individually.

A power management unit (PMU) 115 receives an external power supply voltage Vdd (for example, +3V relative to a reference voltage, or ground). The PMU 115 generates a plurality of internal operative voltages $V_1$-$V_n$, which are supplied to the read/write unit 110 (for implementing different operations on the matrix 105, such as erasing, programming, soft programming and reading); the operative voltages $V_1$-$V_n$, span a wide range of values (for example, from -10V to +10V).

The PMU 115 includes a timing unit 120, which generates a clock signal $Ck(f_{max})$ having a frequency $f_{max}$. A band-gap circuit 125 provides a reference voltage Vr; the reference voltage Vr has a value (such as 840 mV) that is very accurate and stable. A trimmer 127 is used to adjust the value of the reference voltage Vr (for example, in a range of ±40 mV).

For each operative voltage $V_i$ (with i=1 ... n), the PMU 115 further includes a corresponding functional block $130_i$. Each functional block $130_i$ is based on a charge pump $135_i$, which generates the operative voltage $V_i$ from the power supply voltage Vdd. Operation of the charge pump $135_i$ involves the continuous accumulation and transfer of electric charge in a sequence of capacitors, under the control of multiple phase signals (denoted as a whole with $\phi_i$) that are provided by a phase generator $140_i$.

A regulator $145_i$ is input the operative voltage $V_i$ and the reference voltage Vr. As described in detail in the following, the regulator $145_i$ outputs a logic enabling signal $EN_i$ according to a comparison between the operative voltage $V_i$ (suitably scaled) and the reference voltage; particularly, the enabling signal $EN_i$ is asserted when the operative voltage $V_i$ is different from the desired value and is deasserted otherwise. The enabling signal $EN_i$ is provided to a control block $150_i$. The control block $150_i$ transmits the clock signal Ck from the timing unit 120 to the phase generator $140_i$ when the enabling signal $EN_i$ is asserted and blocks the clock signal Ck when the enabling signal $EN_i$ is deasserted.

In this way, the phase generator $140_i$ will receive a clock signal $Ck(f_i)$, which has a frequency $f_i$ depending on the working condition of the charge pump $135_i$. Particularly, when no load is connected to the charge pump $135_i$ the operative voltage $V_i$ remains at the desired value; therefore, the enabling signal $EN_i$ is always deasserted and no clock signal Ck is transmitted to the phase generator $140_i$ (so that the charge pump $135_i$ is turned off, thereby reducing the power consumption of the flash memory 100). Conversely, when the operative voltage $V_i$ is in use the charge pump $135_i$ is connected to a load that absorbs a corresponding current (for example, of the order of some μA). The electric charge supplied by the charge pump $135_i$ lowers the operative voltage $V_i$; therefore, the enabling signal $EN_i$ is asserted and the clock signal Ck is transmitted to the phase generator $140_i$ (so as to restore the desired value of the operative voltage $V_i$). In this way, the operative voltage $V_i$ is maintained substantially constant under changing load conditions.

Similar considerations apply if the flash memory has a different structure or includes equivalent units; moreover, the flash memory (and particularly its power management unit) can be dimensioned for working with different voltages and/or currents. However, the concepts of the present invention are also applicable to other embodiments where the reference voltage is generated with an equivalent circuit, when the charge pumps are replaced with different voltage booster circuits (or any other means for generating the operative voltages from the power supply voltage), and the like.

Figure 2:
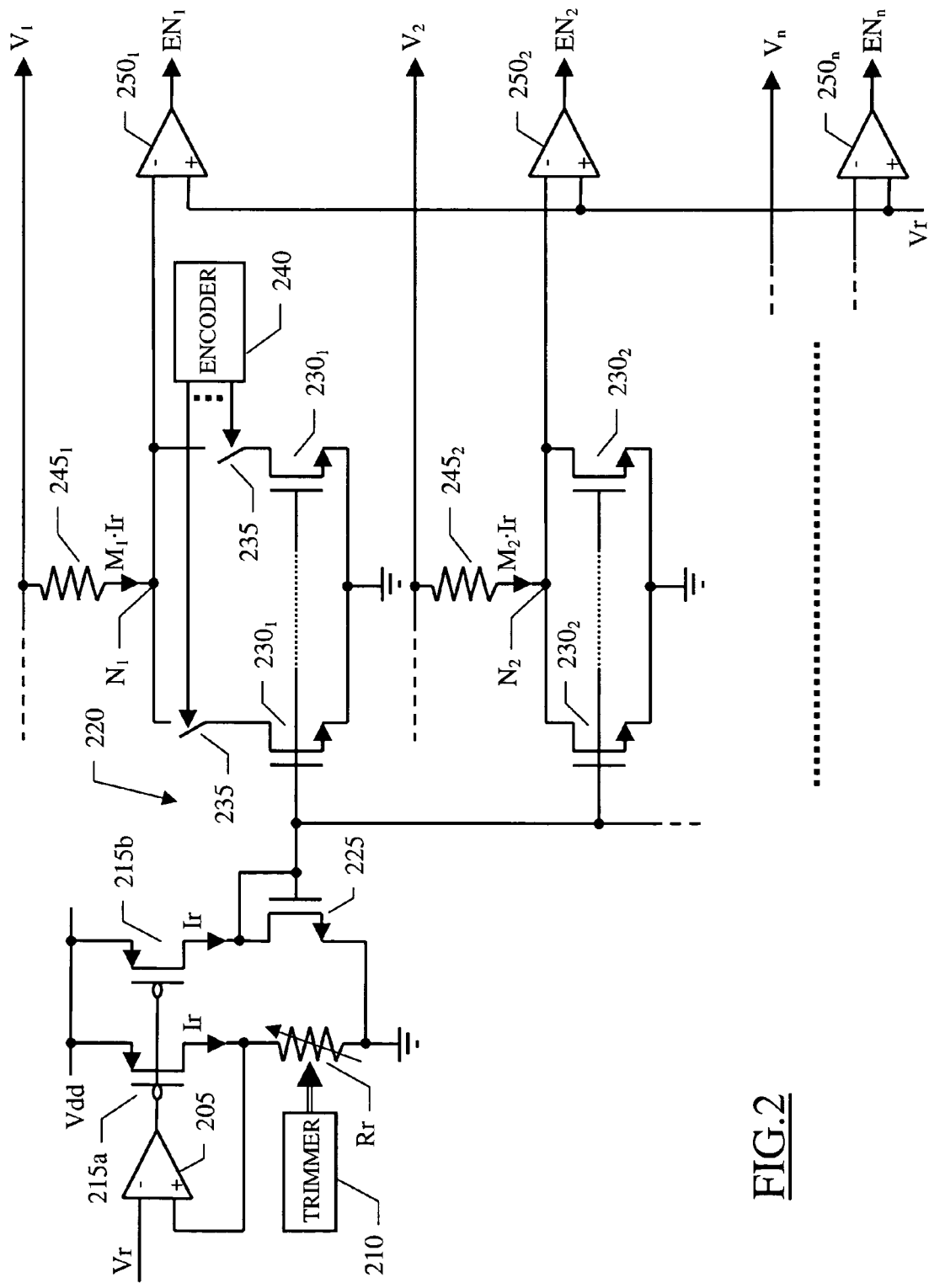
FIG. 2 is a schematic block diagram of an embodiment of the power management unit.

Considering now FIG. 2, the reference voltage Vr is provided to a buffer that is implemented with an operational amplifier 205 in the follower configuration. Particularly, the operational amplifier 205 receives the reference voltage Vr at its inverting input terminal. A reference resistor Rr is connected between the non-inverting input terminal of the operational amplifier 205 and a ground terminal; the reference resistor Rr consists of a plurality of basic blocks connected in series, which basic blocks can be individually short-circuited so as to obtain the desired resistance Rr (in the following, the values of the electrical quantities will be denoted with the same symbols used to identify the corresponding components). A trimmer 210 is used to control the configuration of the reference resistor Rr (and then its resistance). Therefore, a reference current Ir=Vr/Rr will flow through the reference resistor Rr. For example, the resistance Rr can be set to a value in the range 0.75-0.9 kΩ so as to provide a reference current Ir=1 μA.

A pair of PMOS transistors 215a and 215b are used to replicate the reference current Ir, so that it can be supplied to a multiple current mirror 220 (being implemented with NMOS transistors). Particularly, the PMOS 215a has the source terminal connected to a power supply terminal (providing the voltage Vdd); the gate terminal and the drain terminal of the PMOS 215a are connected to the output terminal and to the non-inverting input terminal, respectively, of the operational amplifier 205. Likewise, the PMOS 215b has the source terminal connected to the power supply terminal and the gate terminal connected to the output terminal of the operational amplifier 205. The drain terminal of the PMOS 215b is connected to the drain terminal of an NMOS transistor 225, which defines an input leg of the current mirror 220; the source terminal of the NMOS 225 is connected to the ground terminal, and the gate terminal is short-circuited to its drain terminal.

The current mirror 220 has an output leg for each operative voltage $V_i$; the output leg consists of multiple NMOS transistors $230_i$ (with the same size as the NMOS 225), which are connected in parallel.

Particularly, in each output leg for the operative voltages $V_j$ different from $V_1$ (i.e., j=2 ... n) the NMOS $230_j$ have the source terminals that are connected to the ground terminal and the gate terminals that are connected to the gate terminal of the NMOS 225; the drain terminals of the NMOSs $230_j$ are connected together to define a measuring node $N_j$. The NMOSs $230_j$ for the operative voltage $V_j$ are in a predefined number $M_j$.

Likewise, the NMOSs $230_1$ in the output leg for the operative voltage $V_1$ have the source terminals that are connected to the ground terminal and the gate terminals that are connected to the gate terminal of the NMOS 225. However, in this case each NMOS $230_1$ has the drain terminal that is connected to a first terminal of an electronic switch 235; the second terminals of all the switches 235 are connected together to define a further measuring node $N_1$. Each switch 235 is controlled by a corresponding signal, which is provided by an encoder 240 (in response to a digital code, for example, of 5 bits). The NMOSs $230_1$ for the operative voltage $V_1$ are in a predefined number $Mmax_1$; the encoder 240 closes a selected number $M_1$ of switches 235, so that the corresponding NMOSs $230_1$ are connected in parallel (between the ground terminal and the measuring node $N_1$). In this way, the value of the operative voltage $V_1$ can be updated dynamically (for example, during a programming operation of the flash memory the operative voltage $V_1$ is used to apply programming pulses to the selected memory cells with values increasing by steps of 840 mV).

A mirroring factor between each output leg (for the operative voltage $V_i$) and the input leg of the current mirror 220 is equal to $M_i$; as a consequence, the reference current Ir, scaled according to the mirroring factor $M_i$, will be reflected to the measuring node $N_i$. The scaled reference current $M_i \cdot Ir$ is supplied to a rating resistor $245_i$, which is connected between the measuring node $N_i$ and the output terminal of the charge pump providing the operative voltage $V_i$. The rating resistor $245_i$ consists of a predefined number $K_i$ of basic blocks connected in series (each one having a resistance Ro); therefore, the rating resistor $245_i$ will have a total resistance equal to $K_i \cdot Ro$. The measuring node $N_i$ is also connected to the inverting input terminal of a comparator $250_i$; the non-inverting input terminals of all the comparators $250_i$ receive the reference voltage Vr. The output terminal of the comparator $250_i$ provides the enabling signal $EN_i$ (which is asserted when the voltage at the measuring node $N_i$ differs from the reference voltage Vr, and is deasserted otherwise).

In a steady condition, the voltage at the measuring node $N_i$ matches the reference voltage Vr. Therefore, denoting with $Vt_i$ the voltage drop at the rating resistor $245_i$, the operative voltage $V_i$ will be maintained at the value:

$$V_i=Vr+Vt_i=Vr+(K_i \cdot Ro)(M_i \cdot Ir)=Vr+(K_i \cdot Ro)(M_i \cdot Vr/Rr)=Vr \cdot [1+(K_i \cdot M_i)(Ro/Rr)]$$

Therefore, the operative voltage $V_i$ can be regulated with a high accuracy. Indeed, the operative voltage $V_i$ depends on the reference voltage Vr (being accurate in its nature) and a scaling factor; the scaling factor consists of an integer ($K_i \cdot M_i$) and the ratio between two resistances (Ro/Rr) of the same nature (which ratio can be controlled with high accuracy in the integrated circuit).

Moreover, the quality of the regulation can be further improved through an additional trimming of the reference resistor (based on the measure of the operative voltage $V_1$). In an ideal condition (wherein all the electrical quantities are at their target values, denoted adding the apex "t"), the operative voltage $V_1^t$ is maintained at the value:

$$V_1^t=Vr^t+Vt_1^t$$

Likewise, each one of the other operative voltages $V_j^t$ is maintained at the value:

$$V_j^t=Vr^t+Vt_j^t$$

However, we have that the ratio:

$$Vt_j^t/Vt_1^t=(K_j \cdot Ro \cdot M_j \cdot Ir^t)/(K_1 \cdot Ro \cdot M_1 \cdot Ir^t)=(K_j \cdot M_j)/(K_1 \cdot M_1)$$

consists of a constant value; therefore, we can also express the operative voltage $V_j^t$ as a function of the reference voltage $Vr^t$ and the operative voltage $V_1^t$:

$$V_j^t=Vr^t+Vt_j^t=Vr^t+(K_j \cdot M_j)/(K_1 \cdot M_1) \cdot Vt_1^t=Vr^t+(K_j \cdot M_j)/(K_1 \cdot M_1) \cdot (V_1^t-Vr^t)=Vr^t[1-(K_j \cdot M_j)/(K_1 \cdot M_1)]+(K_j \cdot M_j)/(K_1 \cdot M_1) \cdot V_1^t$$

Conversely, in a real condition the electrical quantities have different values (denoted adding the apex "r") owing to an error dVr of the reference voltage $Vr^r=Vr^t+dVr$. However, it is possible to update the reference resistor Rr (by means of the trimmer 210) and then the reference current $Ir^r$, so as to obtain a rating voltage $Vt_1^r$ that maintains the desired operative voltage $V_1^t$:

$$V_1^t=Vr^t+dVr+Vt_1^t$$

As a consequence, each other rating voltage $Vt_j^r$ will take the value:

$$Vt_j^r=(K_j \cdot M_j)/(K_1 \cdot M_1) \cdot Vt_1^r$$

The corresponding operative voltage $V_j^r$ will then be brought to:

$$V_j^r=Vr^t+dVr+Vt_j^r=Vr^t+dVr+(K_j \cdot M_j)/(K_1 \cdot M_1) \cdot Vt_1^r=Vr^t+dVr+(K_j \cdot M_j)/(K_1 \cdot M_1) \cdot (V_1^t-Vr^t-dVr)=Vr^t \cdot [1-(K_j \cdot M_j)/(K_1 \cdot M_1)]+(K_j \cdot M_j)/(K_1 \cdot M_1) \cdot V_1^t++dVr \cdot [1-(K_j \cdot M_j)/(K_1 \cdot M_1)]=V_j^t+dVr \cdot [1-(K_j \cdot M_j)/(K_1 \cdot M_1)]$$

Therefore, an error $\epsilon_j$ in the operative voltage $V_j^r$ (due to the inaccuracy of the reference voltage $Vr^r$) has the value:

$$\epsilon_j=dVr \cdot [1-(K_j \cdot M_j)/(K_1 \cdot M_1)]$$

Considering that the term $(K_j \cdot M_j)/(K_1 \cdot M_1)$ can be expressed as a function of the generic rated voltages $Vt_1$ and $Vt_j$ by the formula:

$$(K_j \cdot M_j)/(K_1 \cdot M_1)=Vt_j/Vt_1$$

we have that:

$$\epsilon_j=dVr \cdot (1-Vt_j/Vt_1)$$

Therefore, it is possible to determine an optimal value of the rated voltage $Vt_1$ (measured through the resulting operative voltage $V_1$) to be used during the trimming operation. The optimal value of the rated voltage $Vt_1$ is set so as to maintain the error $\epsilon_j$ within a predefined acceptable range. Particularly, the limit conditions are given by the lowest value $V_{j(min)}$ and the highest value $V_{j(max)}$ of the operative voltage $V_j$. In these conditions we have:

$$Vt_j=V_{j(min)}-Vr$$

$$Vt_j=V_{j(max)}-Vr$$

and then:

$$\epsilon_j=dVr \cdot [1-(V_{j(min)}-Vr)/Vt_1]$$

$$\epsilon_j=dVr \cdot [1-(V_{j(max)}-Vr)/Vt_1]$$

Therefore, the solution of that system (with two equations having two variables $Vt_1$ and dVr) provides the optimal value of the rated voltage $Vt_1$ (together with the maximum error dVr that can be tolerated).

For example, when $V_{j(min)}=1.75V$ and $V_{j(max)}=10.00V$ we have (for $Vr=0.84V$):

$$\epsilon_j=dVr \cdot [1-(1.75-0.84)/Vt_1]=dVr \cdot (1-0.91/Vt_1)$$

$$\epsilon_j=dVr \cdot [1-(10.00-0.84)/Vt_1]=dVr \cdot (1-9.16/Vt_1)$$

Let us assume that the acceptable range of the error $\epsilon_j$ is ±50 mV. The worst conditions are given by:

$$-0.050=dVr \cdot (1-0.91/Vt_1)$$

$$+0.050=dVr \cdot (1-9.16/Vt_1)$$

We then have:

$$dVr=-0.050 \cdot Vt_1/(Vt_1-0.91)$$

$$dVr=0.050 \cdot Vt_1/(Vt_1-9.16)$$

from which:

$$-0.050 \cdot Vt_1/(Vt_1-0.91)=0.050 \cdot Vt_1/(Vt_1-9.16)$$

$$-0.050 \cdot (Vt_1-9.16)=0.050 \cdot (Vt_1-0.91)$$

$$-0.050 \cdot Vt_1+0.458=0.050 \cdot Vt_1-0.0455$$

$$0.050 \cdot Vt_1 + 0.050 \cdot Vt_1 = 0.0455 + 0.458$$

$$0.1 \cdot Vt_1 = 0.5035$$

$$Vt_1 = 5.0035V$$

and then:

$$dVr = -0.050 \cdot 5.035/(5.035 - 0.91) = 0.061 = 61mV$$

$$dVr = 0.050 - 5.035/(5.035 - 9.16) = -0.061 = -61mV$$

Therefore, if we trim the reference resistor Rr so as to measure an operative voltage $V_1 = Vr + Vt_1 = 0.84 + 5.035 = 5.875V$ we can maintain the error $\epsilon_j$ of any other operative voltage $V_j$ in the range ±50 mV (while the error of the operative voltage $V_1$ will be substantially zero for any value being set through the corresponding encoder). This result is achieved tolerating a relatively high error dVr (about ±60 mV) in the reference voltage Vr.

Similar considerations apply if the power management unit is implemented with equivalent components; for example, similar resistive means are used to derive the reference current from the reference voltage and/or to derive each rating voltage from the corresponding scaled reference current. Alternatively, the current mirror is implemented with another circuit or using transistors of different type, or the reference resistor is trimmed in another way; moreover, equivalent means can be used to selectively enable the transistors in the first output leg of the current mirror, or only part of the transistors can be disabled. In any case, the concepts of the present invention are also applicable to embodiments where the mirroring factor for one or more other operative voltages can be updated dynamically, or when the power management unit is configured with different values of its operative parameters.

Figure 3:
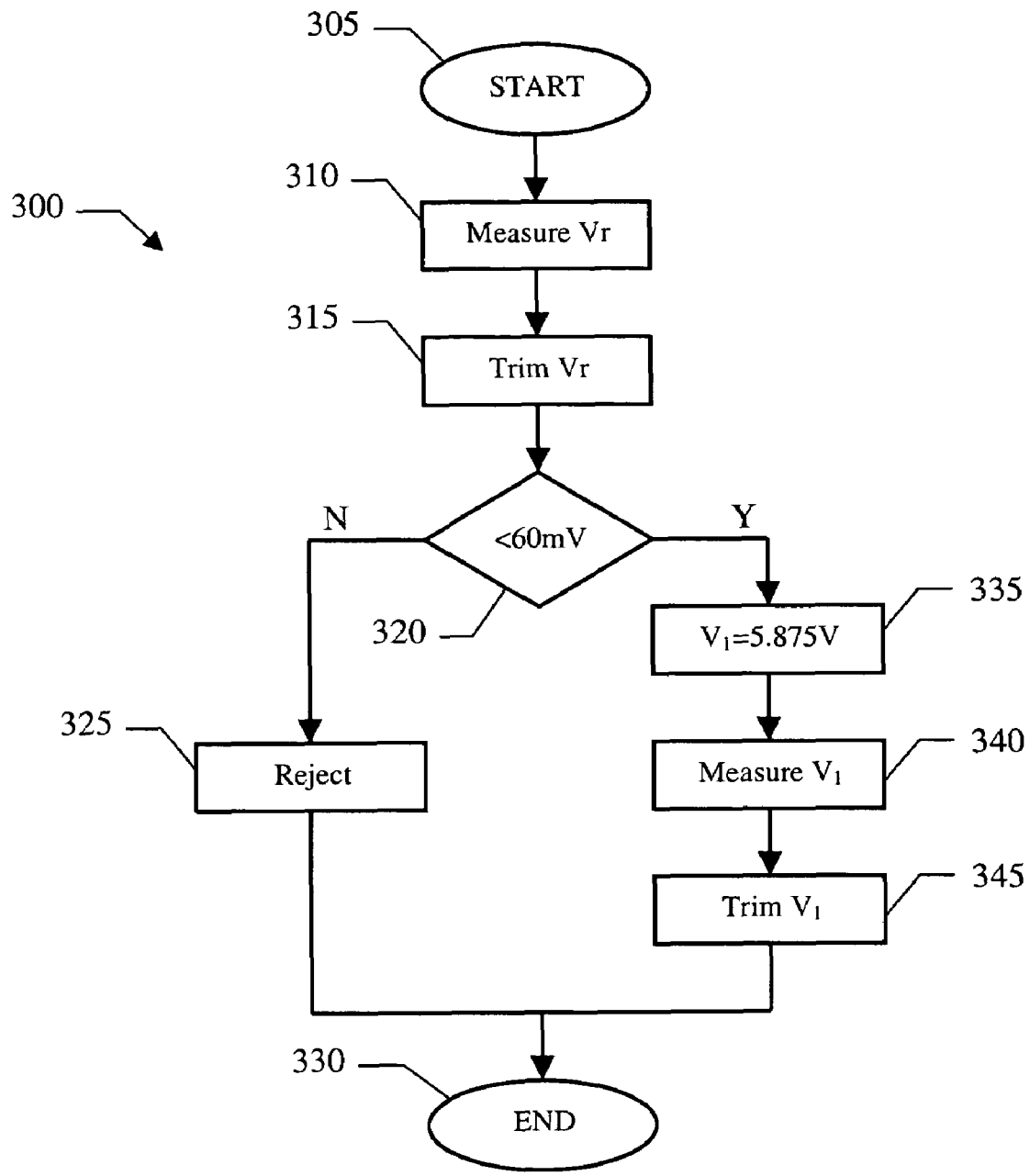
FIG. 3 shows a flow chart describing a process of trimming the power management unit according to an embodiment of the present invention.

The logic of a process of trimming the above-described power management unit is shown in FIG. 3. The trimming process implements a method 300 that starts at block 305. Continuing to block 310, the reference voltage Vr is measured. The method passes to block 315, wherein the band-gap circuit is trimmed to minimize the error dVr of the reference voltage Vr.

A test is made at block 320 to determine whether the error dVr falls within the limits that can be tolerated (i.e., ±60 mV). If not, the device including the power management unit is rejected at block 325 (since the operative voltages $V_i$ could not be regulated with the desired accuracy); the method then ends at the final block 330.

Conversely, the encoder is configured at block 335 so as to provide the value of the operative voltage $V_1 = 5.875V$ (corresponding to the optimal value of the rated voltage $Vt_1$). The method continues to block 340, wherein the actual value of the operative voltage $V_1$ is measured. Proceeding to block 345, the reference resistor Rr is trimmed so as to minimize the error of the operative voltage $V_1$ with respect to its desired value. The method then descends into the final block 330.

Similar considerations apply if the trimming process implements an equivalent method with similar or additional steps.

More generally, an embodiment of the present invention includes a power management unit for a non-volatile memory device. The power management unit includes means for providing a reference voltage; resistive means is used to derive a reference current from the reference voltage. The power management unit further includes means for generating a plurality of operative voltages from a power supply voltage; moreover, means is provided for regulating the operative voltages. In a power management unit according to one embodiment of the invention, for each operative voltage the means for regulating includes means for deriving a scaled reference current from the reference current (according to a scaling factor). Further resistive means is provided for deriving a rating voltage from the scaled reference current. The means for regulating further includes means for deriving a measuring voltage from the operative voltage and the rating voltage. Means is then provided for controlling the operative voltage according to a comparison between the measuring voltage and the reference voltage.

The solution according to embodiments of the invention provides a single regulation structure for the different operative voltages.

Therefore, it is possible to have a common level of quality in the regulation.

Moreover, the devised architecture allows trimming all the operative voltages at the same time (in order to provide the desired accuracy).

The time required for the trimming operation is then strongly reduced, thereby increasing the throughput of the corresponding manufacturing process.

The preferred embodiment of the invention described above offers further advantages.

Particularly, the different scaled reference currents are derived through a multiple current mirror.

Such a circuit scheme is very simple, but at the same time effective.

A suggested choice for implementing each output leg of the current mirror is that of providing a predefined number of basic transistors.

In this way, the mirroring factor for each output leg can be controlled exactly.

Alternatively, the mirroring factor of each output leg of the current mirror is controlled with a different structure; in any case, the use of another circuit scheme for deriving each scaled reference current is contemplated.

As a further enhancement, means is provided for trimming the reference resistor.

This allows a first adjustment of the level of quality in the regulation.

A way to further improve the solution is to provide means for updating one or more of the operative voltages.

The proposed feature allows an additional adjustment of the level of quality in the regulation (based on the measure of those operative voltages). As a consequence, it is possible to relax the requirements of the reference voltage (for the same accuracy of the operative voltages); therefore, the yield of the manufacturing process can be strongly improved.

A suggested choice for implementing the means for updating the operative voltage exploits a structure, which allows selectively disabling at least part of the transistors in the corresponding output leg of the current mirror.

In this way, the scaling factor (and then the operative voltage) can be controlled exactly.

However, the solution according to embodiments of the present invention leads itself to be implemented with a different structure for updating the scaling factor, or even with the operative voltage that is updated acting on the corresponding rating resistor (instead of on the mirroring factor); in any case, an implementation without one or more of the above-mentioned trimming structures is not excluded (even if it is less advantageous).

The power management unit according to embodiments of the invention is specifically designed for a non-volatile memory device; however, different applications are contemplated.

An embodiment of the present invention also includes a method of trimming the devised power management unit (which is based on the setting of a specific operative voltage to a predefined value through the corresponding encoder, followed by the adjustment of the reference resistor so as to measure the desired value of the operative voltage).

The proposed method allows trimming all the operative voltages at the same time through a single measure.

Preferably, the optimal value is calculated so as to maintain an error for a minimum value and a maximum value of all the other operative voltages within an acceptable range.

This ensures that any operative voltage has always the desired accuracy.

However, the value of the operative voltage to be measured can be set in a different way (for example, tolerating a higher error in marginal conditions); in any case, the trimming of the power management unit of the invention with different procedures is not excluded.

Naturally, in order to satisfy local and specific requirements, a person skilled in the art may apply to the solution described above many modifications and alterations all of which, however, are included within the scope of protection of the invention as defined by the following claims.

The invention claimed is:

1. A power management unit for a non-volatile memory device, the power management unit including means for providing a reference voltage, resistive means for deriving a reference current from the reference voltage, means for generating a plurality of operative voltages from a power supply voltage, and means for regulating the operative voltages, wherein for each operative voltage the means for regulating includes means for deriving a scaled reference current from the reference current according to a scaling factor, further resistive means for deriving a rating voltage from the scaled reference current, means for deriving a measuring voltage from the operative voltage and the rating voltage, and means for controlling the operative voltage according to a comparison between the measuring voltage and the reference voltage.

2. The power management unit according to claim 1, wherein the means for deriving the scaled reference current includes a multiple current mirror having an input leg for receiving the reference current and a plurality of output legs for providing the scaled reference currents, a mirroring factor between each output leg and the input leg being equal to the corresponding scaling factor.

3. The power management unit according to claim 2, wherein each output leg includes a predefined number of basic transistors according to the corresponding mirroring factor.

4. The power management unit according to claim 1, further including means for trimming the resistive means.

5. The power management unit according to claim 3, further including means for dynamically updating at least one selected of the operative voltages.

6. The power management unit according to claim 5, wherein the means for dynamically updating each selected operative voltage includes means for selectively disabling at least part of the corresponding basic transistors.

7. A non-volatile memory device including a plurality of memory cells, read/write means for updating a content of the memory cells, and the power management unit according to claim 1 for providing the operative voltages to the read/write means.

8. A method of operating a power management unit in a non-volatile memory device, the method including the steps of:
providing a reference voltage,
deriving a reference current from the reference voltage through resistive means,
generating a plurality of operative voltages from a power supply voltage, and
regulating the operative voltages, wherein for each operative voltage the step of regulating includes:
deriving a scaled reference current from the reference current according to a scaling factor,
deriving a rating voltage from the scaled reference current through further resistive means,
deriving a measuring voltage from the operative voltage and the rating voltage, and
controlling the operative voltage according to a comparison between the measuring voltage and the reference voltage.

9. A method of trimming the power management unit according to claim 5, the method including the steps of:
setting the means for dynamically updating the selected operative voltage to provide a predefined value,
measuring the selected operative voltage, and
setting the means for trimming the resistive means to have the measured selected operative voltage substantially equal to the predefined value.

10. The method according to claim 9, wherein the predefined value is calculated to maintain an error for a minimum value of each operative voltage and for a maximum value of each operative voltage within a predefined acceptable range.

11. A power management circuit, comprising:
a reference voltage generator;
a reference current generator coupled to the reference voltage generator and operable to generate a reference current, the reference current having a value that is a function the reference voltage;
a plurality of operative voltage generators, each operative voltage generator operable to generate a corresponding operative voltage; and
a plurality of voltage regulators coupled to the reference current generator and each voltage regulator coupled to a corresponding operative voltage generator, each voltage regulator being operable to generate a scaled reference current in response to the reference current, each scaled reference current having a value that is equal to the reference current times a scaling factor, and each voltage regulator being further operable to develop a measuring voltage in response to the scaled reference current and to compare the measuring voltage to the reference voltage and to regulate the corresponding operative voltage generator in response to this comparison.

12. The power management circuit of claim 11 wherein each voltage regulator further comprises:
a resistive network coupled between an output node on which the corresponding operative voltage is developed and a measurement node on which the measuring voltage is developed; and
a current generating network coupled between the measurement node and a reference node, the current generating network operable to provide the scaled reference current through the resistive network in response to the reference current.

13. The power management circuit of claim 12 wherein the current generating network comprises a multiple current mirror including a plurality of MOS transistors having their source and drain nodes coupled between the measurement node and the reference node, and having their gate nodes coupled to a gate and drain node of a diode-coupled MOS transistor coupled between an input node and the reference node.

14. The power management circuit of claim 13 wherein the reference current generator comprises:
a operational amplifier having an output, a noninverting input, and an inverting input coupled to receive the reference voltage;
a reference resistor network coupled to the noninverting input and the reference node;
first and second PMOS transistor having their respective source nodes adapted to receive a supply voltage and having their gate nodes coupled to the output of the operation amplifier, with a drain node of the first PMOS transistor coupled to the noninverting input of the amplifier and a drain node of the second PMOS transistor coupled to the input node of the multiple current mirror.

15. The power management circuit of claim 14 wherein each regulator further comprises a comparator having a first input coupled to receive the reference voltage, a second input coupled to the measurement node, and an output coupled to the corresponding operative voltage generator, the comparator operable to develop an enable signal on its output and apply the enable signal to active and deactivate the operative voltage generator.

16. The power management circuit of claim 11 wherein each operative voltage generator comprises a charge pump.

17. A memory device, comprising:
a matrix of memory cells;
a read/write circuit coupled to the matrix; and
a power management circuit coupled to the read/write circuit to supply the operative voltages to the read/write circuit, the power management circuit including,
a reference voltage generator;
a reference current generator coupled to the reference voltage generator and operable to generate a reference current, the reference current having a value that is a function the reference voltage;
a plurality of operative voltage generators, each operative voltage generator operable to generate a corresponding operative voltage; and
a plurality of voltage regulators coupled to the reference current generator and each voltage regulator coupled to a corresponding operative voltage generator, each voltage regulator being operable to generate a scaled reference current in response to the reference current, each scaled reference current having a value that is equal to the reference current times a scaling factor, and each voltage regulator being further operable to develop a measuring voltage in response to the scaled reference current and to compare the measuring voltage to the reference voltage and to regulate the corresponding operative voltage generator in response to this comparison.

18. The memory device of claim 17 wherein the memory device comprises a nonvolatile memory device.

19. The memory device of claim 18 wherein the nonvolatile memory device comprises a FLASH memory device.

20. The memory device of claim 19 wherein each operative voltage generator comprises a charge pump.

21. The memory device of claim 20 wherein each voltage regulator is further operable to generate a corresponding enable signal responsive to comparing the measuring voltage to the reference voltage, and wherein each voltage regulator further comprises:
a phase generator coupled the corresponding charge pump;
a controller coupled to the phase generator the circuit and receiving the enable signal, and adapted to receive a clock signal.

22. A method of generating a plurality of operative voltages, each operative voltage being generated through a corresponding voltage generator and the method comprising:
generating a reference voltage;
generating a reference current in response to the reference voltage;
developing each of the operative voltages, each operative voltage having a value that is a function of the reference current; and
for each operative voltage,
deriving a corresponding measured voltage,
comparing the measured voltage to the reference voltage, and
regulating a value of the operative voltage in response to the comparison of the measured and reference voltages.

23. The method of claim 22 wherein developing each of the operative voltages comprises:
for each operative voltage,
scaling the reference current to provide a scaled reference current;
generating a rating voltage in response to the scaled reference current; and
generating the operative voltage having a value equal to the reference voltage plus the rating voltage.

24. The method of claim 23 further comprising adjusting the value of the reference voltage to thereby adjust the values of the operative voltages.

25. The method of claim 22 wherein some of the operative voltage are positive voltages and some are negative voltages.

* * * * *